US012777640B2

(12) United States Patent
Inoue

(10) Patent No.: US 12,777,640 B2
(45) Date of Patent: Oct. 27, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Shinji Inoue, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 1074 days.

(21) Appl. No.: 17/875,096

(22) Filed: Jul. 27, 2022

(65) Prior Publication Data

US 2023/0068043 A1 Mar. 2, 2023

(30) Foreign Application Priority Data

Sep. 2, 2021 (JP) ................................. 2021-143096

(51) Int. Cl.

| | |
|---|---|
| ***H10B 43/27*** | (2023.01) |
| ***H10B 43/30*** | (2023.01) |
| ***H10D 30/01*** | (2025.01) |
| ***H10D 30/69*** | (2025.01) |
| ***H10D 62/85*** | (2025.01) |
| ***H10D 64/01*** | (2025.01) |

(52) U.S. Cl.

CPC ............. *H10B 43/27* (2023.02); *H10B 43/30* (2023.02); *H10D 30/0413* (2025.01); *H10D 30/69* (2025.01); *H10D 62/8503* (2025.01); *H10D 64/037* (2025.01)

(58) Field of Classification Search

CPC .... H10B 43/27; H10B 43/30; H10D 30/0413; H10D 30/69; H10D 62/8503; H10D 64/037; H10D 64/685; G11C 16/0416; G11C 16/10

See application file for complete search history.

(56) References Cited

U.S. PATENT DOCUMENTS

2023/0068043 A1* 3/2023 Inoue ..................... H10B 43/27

FOREIGN PATENT DOCUMENTS

| | | |
|---|---|---|
| JP | S61-097867 A | 5/1986 |
| JP | 2002-009181 A | 1/2002 |
| JP | 2009-289823 A | 12/2009 |

OTHER PUBLICATIONS

Office Action issued in the corresponding Japanese patent Application No. 2021-143096 dated Jun. 25, 2024, w/ English Translation.

* cited by examiner

*Primary Examiner* — Jack S Chen
(74) *Attorney, Agent, or Firm* — Rimon P.C.

(57) ABSTRACT

A semiconductor device capable of shortening an erasing time and suppressing deterioration of retention characteristics is provided. A semiconductor device includes: a semiconductor substrate having a main surface; a gate insulating film formed on the main surface; and a gate electrode formed on the gate insulating film. The gate insulating film includes a first silicon nitride film, and a first silicon oxide film arranged between the main surface and the first silicon nitride film and in contact with the first silicon nitride film. A Si—Si bond is formed in a boundary portion between the first silicon oxide film first silicon nitride film.

6 Claims, 10 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2021-143096 filed on Sep. 2, 2021 including the specification, drawings and abstract is incorporated herein by reference in its entirety.

BACKGROUND

The present invention relates to a semiconductor device and a method of manufacturing the same.

There are disclosed techniques listed below.

[Patent Document 1] Japanese Unexamined Patent Application Publication No. 2009-289823

Conventionally, there is a semiconductor device including a non-volatile semiconductor memory in which a gate insulating film is configured by a laminated film (ONO film) of a bottom oxide film, a nitride film, and a top oxide film (for example, Patent Document 1).

In a non-volatile semiconductor memory, electrons are injected from a semiconductor substrate into a nitride film via a bottom oxide film at the time of writing, and holes are injected from the semiconductor substrate into the nitride film via the bottom oxide film at the time of erasing.

SUMMARY

In recent years, non-volatile semiconductor memories have been required to reduce writing/erasing voltages and shorten a memory erasing time. As a method of realizing these at the same time, there is a method of reducing a thickness of a bottom oxide film. This improves injection efficiency of electrons and injection efficiency of holes from a semiconductor substrate to a nitride film.

However, when the thickness of the bottom oxide film is reduced, the electrons injected into the nitride film are likely to tunnel into the semiconductor substrate via the bottom oxide film, and this causes data retention characteristics to deteriorate.

The other object and novel features will become apparent from description of the present specification and the accompanying drawings A semiconductor device according to the present embodiment includes: a semiconductor substrate having a main surface; a gate insulating film formed on the main surface; and a gate electrode formed on the gate insulating film. Here, the gate insulating film includes a first silicon nitride film, and a silicon oxide film arranged between the main surface and the first silicon nitride film and in contact with the first silicon nitride film. Further, a Si—Si bond is formed in a boundary portion between the silicon oxide film and the first silicon nitride film.

According to the semiconductor device of the present embodiment, it is possible to shorten an erasing time, and suppress deterioration of retention characteristics.

DETAILED DESCRIPTION

Figure 1:
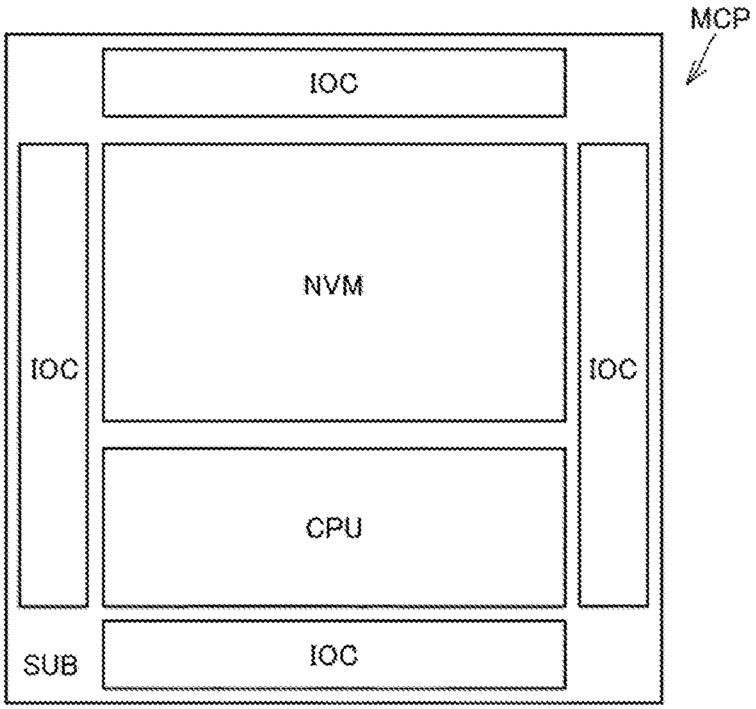
FIG. 1 is a plan view of a semiconductor device according to the present embodiment.

Hereinafter, an embodiment will be described with reference to the drawings. Note that the same reference numerals are respectively assigned to the same or similar portions in the following drawings, and explanation thereof is not repeated.

Configuration of Semiconductor Device

As illustrated in FIG. 1, a semiconductor device MCP according to the present embodiment includes a non-volatile memory circuit NVM, a logic circuit LOG, and input/output circuits IOC, which are formed on a semiconductor substrate SUB.

The non-volatile memory circuit NVM includes a plurality of memory cells. Each of the plurality of memory cells includes a MONOS type transistor MT illustrated in FIG. 2. The logic circuit LOG is a CPU (Central Processing Unit), for example. Each of the input/output circuits IOC is an interface for inputting write data and outputting read data with between the transistor MT and an external device connected to the semiconductor device MCP.

Configuration of Transistor MT

Figure 2:
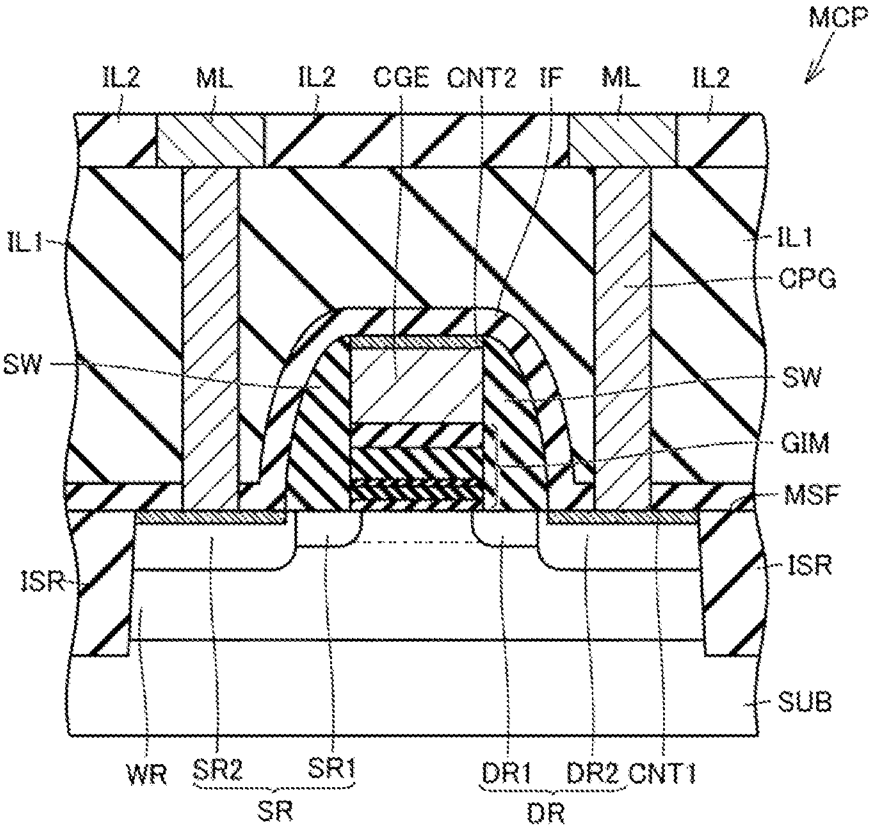
FIG. 2 is a sectional view illustrating a configuration of a non-volatile memory of the semiconductor device according to the present embodiment.

As illustrated in FIG. 2, the transistor MT includes the semiconductor substrate SUB, a gate insulating film GIM, a gate electrode CGE, sidewall spacers SW, an insulating film IF, interlayer insulating films IL1 and IL2, contact plugs CPG, and wirings ML.

The semiconductor substrate SUB has a main surface MSF. The semiconductor substrate SUB includes a source region SR, a drain region DR, a well region WR, and an element isolation region ISR. Each of the source region SR, the drain region DR, the well region WR, and the element isolation region ISR is arranged in the main surface MSF. The semiconductor substrate SUB is a single crystal silicon (Si) substrate, for example.

The source region SR has a first portion SR1 and a second portion SR2. The first portion SR1 is arranged so as to overlap with the sidewall spacer SW. When the main surface MSF is viewed in a plan view, the second portion SR2 is arranged outside the first portion SR1. The impurity concentration of the first portion SR1 is lower than the impurity concentration of the second portion SR2. The first portion SR1 is a low concentration diffusion layer (Lightly Doped Drain: LLD) with respect to the second portion SR2.

The drain region DR is arranged at a distance from the source region SR in a direction along the main surface MSF. The drain region DR has a third portion DR1 and a fourth portion DR2. The third portion DR1 is arranged so as to overlap with the sidewall spacer SW. When the main surface MSF is viewed in a plan view, the fourth portion DR2 is arranged outside the third portion DR1. The impurity concentration of the third portion DR1 is lower than the impurity concentration of the fourth portion DR2. The third portion DR1 is a low concentration diffusion layer (Lightly Doped Drain: LLD) with respect to the fourth portion DR2.

When the main surface MSF is viewed in a plan view, the well region WR is arranged so as to surround the source region SR and the drain region DR.

Each of the source region SR and the drain region DR has a first conductive type. The well region WR has a second conductive type opposite to the first conductive type. For example, the first conductive type is an n-type, and the second conductive type is a p-type.

Figure 3:
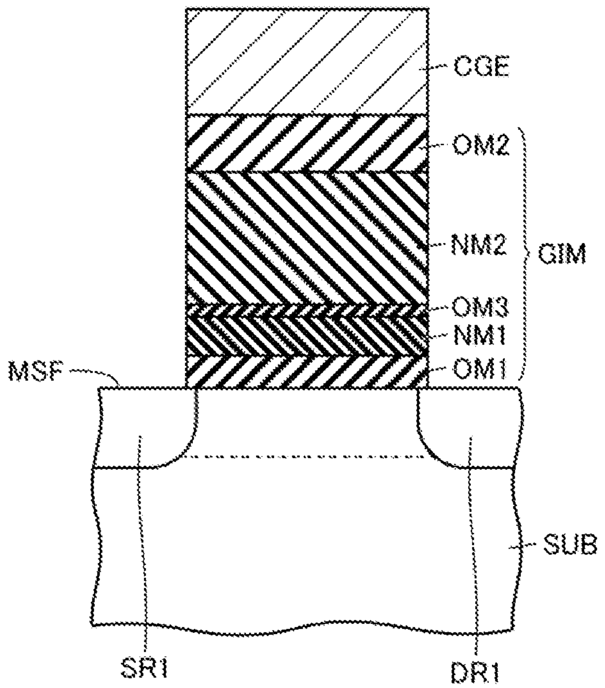
FIG. 3 is u partially enlarged view of a gate insulating film illustrated in FIG. 2.

The gate insulating film GIM and the gate electrode CGE has a structure illustrated in FIG. 3. Details of the structure of the gate insulating film GIM and the gate electrode CGE will be described later.

The sidewall spacers SW are arranged on sidewalls of the gate electrode CGE. The sidewall spacers SW are arranged on the first portion SR1 of the source region SR and the third portion DR1 of the drain region DR. Material constituting the sidewall spacer SW is silicon nitride ($Si_3N_4$), for example.

The insulating film IF is arranged so as to cover the gate electrode CGE, the sidewall spacers SW, and a portion of the main surface MSF where the gate electrode CGE and the sidewall spacers SW are not formed. Material constituting the insulating film IF is silicon nitride ($Si_3N_4$), for example.

The interlayer insulating film IL1 is arranged on the insulating film IF. An upper surface of the interlayer insulating film IL1 is flattened. Material constituting the interlayer insulating film IL1 is silicon oxide ($SiO_2$), for example.

The contact plugs CPG are embedded in through holes that penetrate the interlayer insulating film IL1 and the insulating film IF. The contact plug CPG is electrically connected to the second portion SF2 of the source region SR. For example, the contact plug CPG is electrically connected to the second portion SR2 via a silicide CNT1 arranged on the second portion SR2.

The wirings ML and the interlayer insulating film IL2 are arranged on the interlayer insulating film IL1. The wirings ML are electrically connected to the contact plugs CPG. The interlayer insulating film IL2 is arranged around the wirings ML.

Next, details of the structure of the gate insulating film GIM and the gate electrode CCE will be described with reference to FIG. 3. Note that in FIG. 3, illustration of the structure other than the semiconductor substrate SUB, the gate insulating film GIM, and the gate electrode CGE is omitted.

The gate insulating film GIM includes a first silicon oxide film OM1, a first silicon nitride film NM1, a third silicon oxide film OM3, a second silicon nitride film NM2, and a second silicon oxide film OM2. The first silicon oxide film OM1, the first silicon nitride film NM1, the third silicon oxide film OM3, the second silicon nitride film NM2, and the second silicon oxide film OM2 are laminated in this order from the main surface MSF side.

The first silicon oxide film OM1 is a bottom oxide film. The second silicon oxide film OM2 is a top oxide film. The first silicon nitride film NM1 is sandwiched between the first silicon oxide film OM1 and the third silicon oxide film OM3. The second silicon nitride film NM2 is sandwiched between the third silicon oxide film OM3 and the second silicon oxide film OM2.

A thickness of the first silicon oxide film OM1 is thinner than a thickness of the second silicon oxide film OM2, for example. As described above, the thinner the thickness of the first silicon oxide film OM1 becomes, the more retention characteristics deteriorates. For that reason, the thickness of the first silicon oxide film OM1 may set so as to be able to realize the required retention characteristics. For example, the thickness of the first silicon oxide film OM1 is 1 nm or thicker and 3 nm or thinner. A thickness of the first silicon nitride film NM1 is thicker than the thickness of the first silicon oxide film OM1, for example. A thickness of the third silicon oxide film OM3 is thinner than the thickness of the first silicon oxide film OM1, for example. A thickness of the second silicon nitride film NM2 is thicker than the thickness of the first silicon nitride film NM1, for example. The thickness of the second silicon oxide film OM2 is thicker than the thickness of the first silicon nitride film NM1, and is thinner than the thickness of the second silicon nitride film NM2, for example.

A bandgap of each of the first silicon oxide film OM1, the third silicon oxide film OM3, and the second silicon oxide film OM2 is larger than a bandgap of each of the first silicon nitride film NM1 and the second silicon nitride film NM2. As a result, each of the first silicon nitride film NM1 and the second silicon nitride film NM2 acts as an accumulation film in which electrons are accumulated. Note that each of the third silicon oxide film OM3, the second silicon nitride film NM2, and the second silicon oxide film OM2, which are laminated and arranged on the first silicon nitride film NM1, may be configured by other material so long as the magnitude relationship of the respective bandgaps described above are satisfied.

The gate electrode CGE is arranged on the second silicon oxide film OM2. The gate electrode CGE is formed of polycrystal silicon doped with impurities, for example. The gate electrode CGE is electrically connected to a contact plug (not illustrated in FIG. 3). The gate electrode CGE is electrically connected to the contact plug via a silicide CNT2, for example. Each memory cell executes a writing or erasing operation in accordance with voltage applied between the gate electrode CGE of the transistor MT and the semiconductor substrate SUB. When an electric potential of the gate electrode CGE is set to a positive electric potential sufficiently larger than an electric potential of the semiconductor substrate SUB, each memory cell executes a writing operation. When the electric potential of the gate electrode CGE is set to a negative electric potential sufficiently larger than the electric potential of the semiconductor substrate SUB, each memory cell executes an erasing operation.

Figure 4:
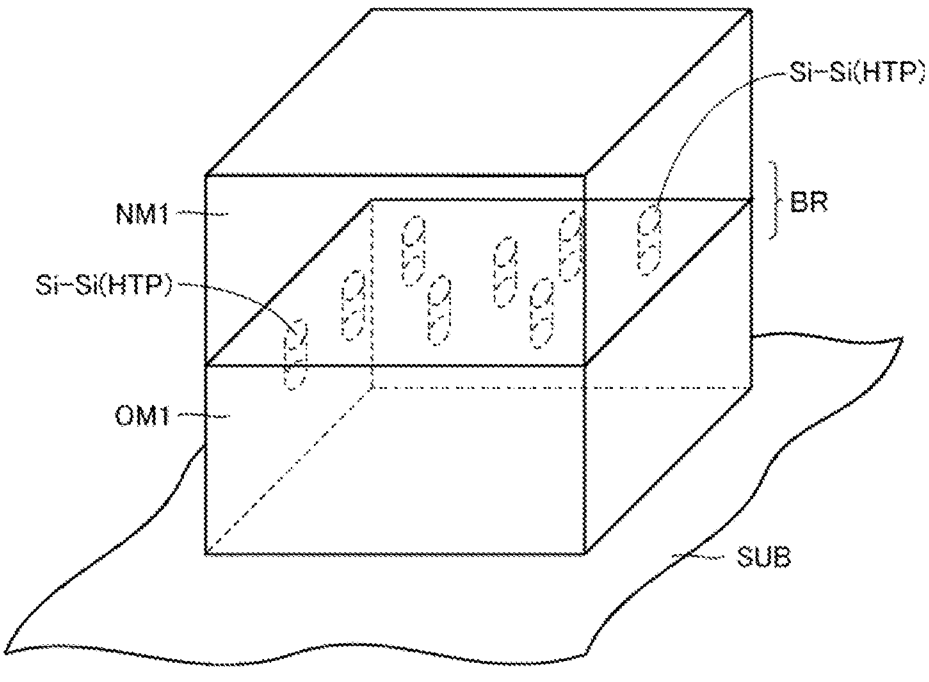
FIG. 4 is a schematic diagram for explaining Si—Si bonds formed in a boundary portion between a bottom oxide film and a first silicon nitride film in the gate insulating film illustrated in FIG. 3.
Figure 5:
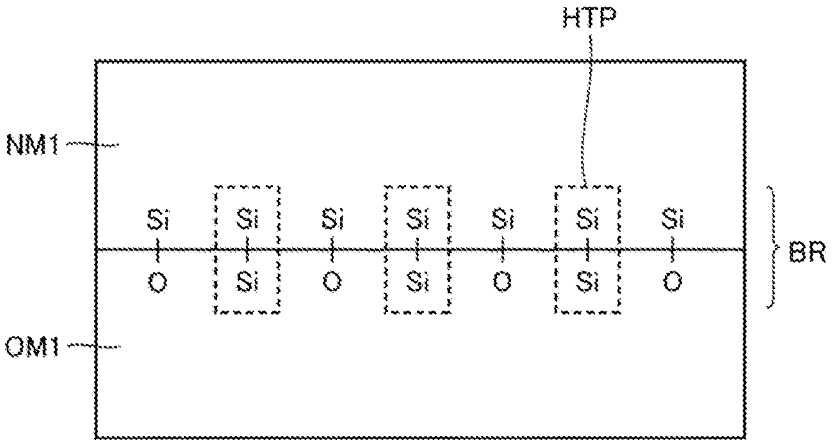
FIG. 5 is a schematic diagram for explaining the Si—Si bonds formed in the boundary portion between the bottom oxide film and the first silicon nitride film in the gate insulating film illustrated in FIG. 3.

As illustrated in FIG. 4 and FIG. 5, Si—Si bonds and O—Si bonds are formed in a boundary portion between the first silicon oxide film OM1 and the first silicon nitride film NM1. The boundary portion between the first silicon oxide film OM1 and the first silicon nitride film NM1 is a region including an interface between the first silicon oxide film OM1 and the first silicon nitride film NM1. Each of the Si—Si bonds is one in which a Si atom of the first silicon oxide film OM1 is bonded to a Si atom of the first silicon nitride film NM1. Each of the O—Si bonds is one in which an O atom of the first silicon oxide film OM1 is bonded to a Si atom of the first silicon nitride film NM1.

In the gate insulating film GIM, the Si—Si bonds are formed in only a boundary portion BR. The Si—Si bonds are locally formed in only the boundary portion BR in a laminating direction of the gate insulating film GIM. The Si—Si bonds are formed discretely with each other in a direction orthogonal to the laminating direction of the gate insulating film GIM. The Si—Si bond is adjacent to the O—Si bond.

In a region where the Si—Si bonds are formed in the boundary portion BR, holes are injected from the semiconductor substrate SUB into the first silicon nitride film NM1 at the time of the erasing operation as compared with a region where the O—Si bonds are formed. Namely, in the boundary portion BR, the region where the Si—Si bonds are formed acts as a point where holes are easily injected at the erasing operation (hereinafter, referred to as a hole-through point HTP). A potential barrier against the holes at the hole-through point HTP is lower than a potential barrier against the holes the region where the O—Si bonds are formed.

In the boundary portion BR, density (unit: pieces/cm$^2$) of the Si—Si bonds is lower than density (unit: pieces/cm$^2$) of the O—Si bonds. The density of the Si—Si bonds is calculated using a scanning tunneling microscope (STM) or an atom probe field ion microscope. Specifically, by using the scanning tunneling microscope (STM) or the atom probe field ion microscope, atomic arrangement of a cross section of the boundary portion BR along the laminating direction of the gate insulating film GIM is analyzed to measure the number of Si—Si bonds (linear density). A measured value is expanded to the area by calculation to calculate surface density, By doing so, the bandgap in the vicinity of the interface of the first silicon oxide film OM1 becomes larger than the bandgap of the first silicon nitride film NM1 (see FIG. 17 and FIG. 19).

Preferably, the density of the Si—Si bonds is $7\times10^{12}$ pieces/cm$^2$ or less. In a case where the density of the Si—Si bonds exceeds $7\times10^{12}$ pieces/cm$^2$, as compared with the case where the density is $7\times10^{12}$ pieces/cm$^2$ or less, the electrons injected into the first silicon nitride film NM1 are easily removed when the transistor MT (the memory cell) left unattended, and thus, the retention characteristics deteriorates. If the density of the Si—Si bonds is $7\times10^{12}$ pieces/cm$^2$ or less, the ease of removal of the electrons injected into the first silicon nitride film NM1 is suppressed to the same level as that of a conventional semiconductor device in which no Si—Si bond is formed and a thickness of a bottom oxide film is equivalent to a thickness of a first silicon oxide film OM1. Therefore, it is possible to suppress deterioration of the retention characteristics.

Method of Manufacturing Semiconductor Device

Figure 6:
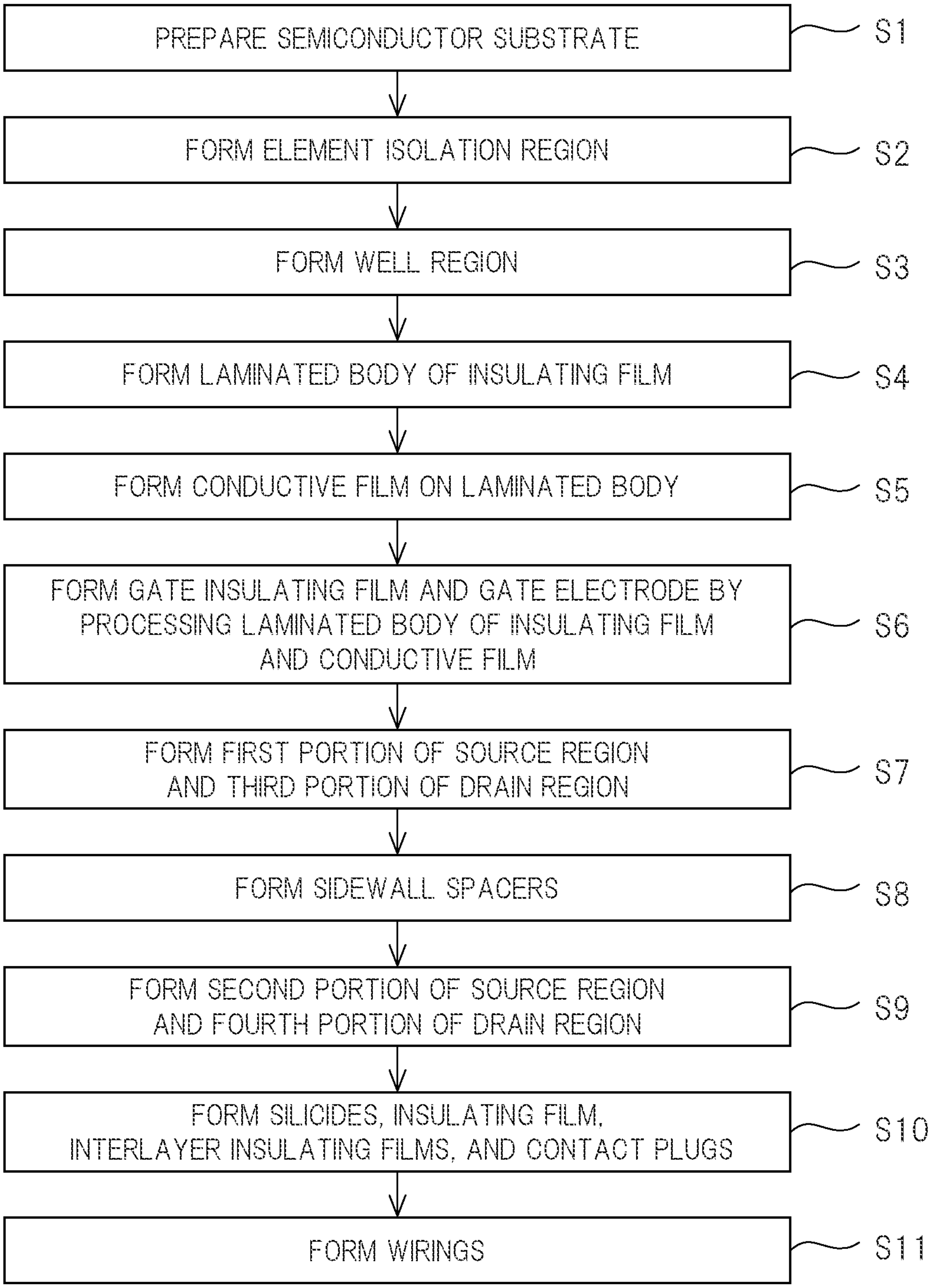
FIG. 6 is a flowchart illustrating a method of manufacturing a semiconductor device according to the present embodiment.

As illustrated in FIG. 6, a method of manufacturing the semiconductor device MCP includes a step (S1) to a step (S11).

First, a semiconductor substrate SUB having a main surface MSF is prepared (a step (S1)), The semiconductor substrate SUB is a silicon monocrystal substrate.

Subsequently, an element isolation region ISR is formed in the semiconductor substrate SUB (a step (S2)). A method of forming the element isolation region ISR is an STI (Shallow Trench Isolation) method or a LOCOS (LOCal Oxidation of Si) method, for example.

Subsequently, a well region WR is formed in the semiconductor substrate SUB (a step (S3)). A method of forming the well region WR includes a photolithography process and an ion implantation process. In a case where a p-type well region WR is to be formed, for example, ions of p-type impurities such as boron (B) are injected. In a case where an n-type well region WR is to be formed, for example, ions of n-type impurities such as arsenic (As) are injected.

Figure 7:
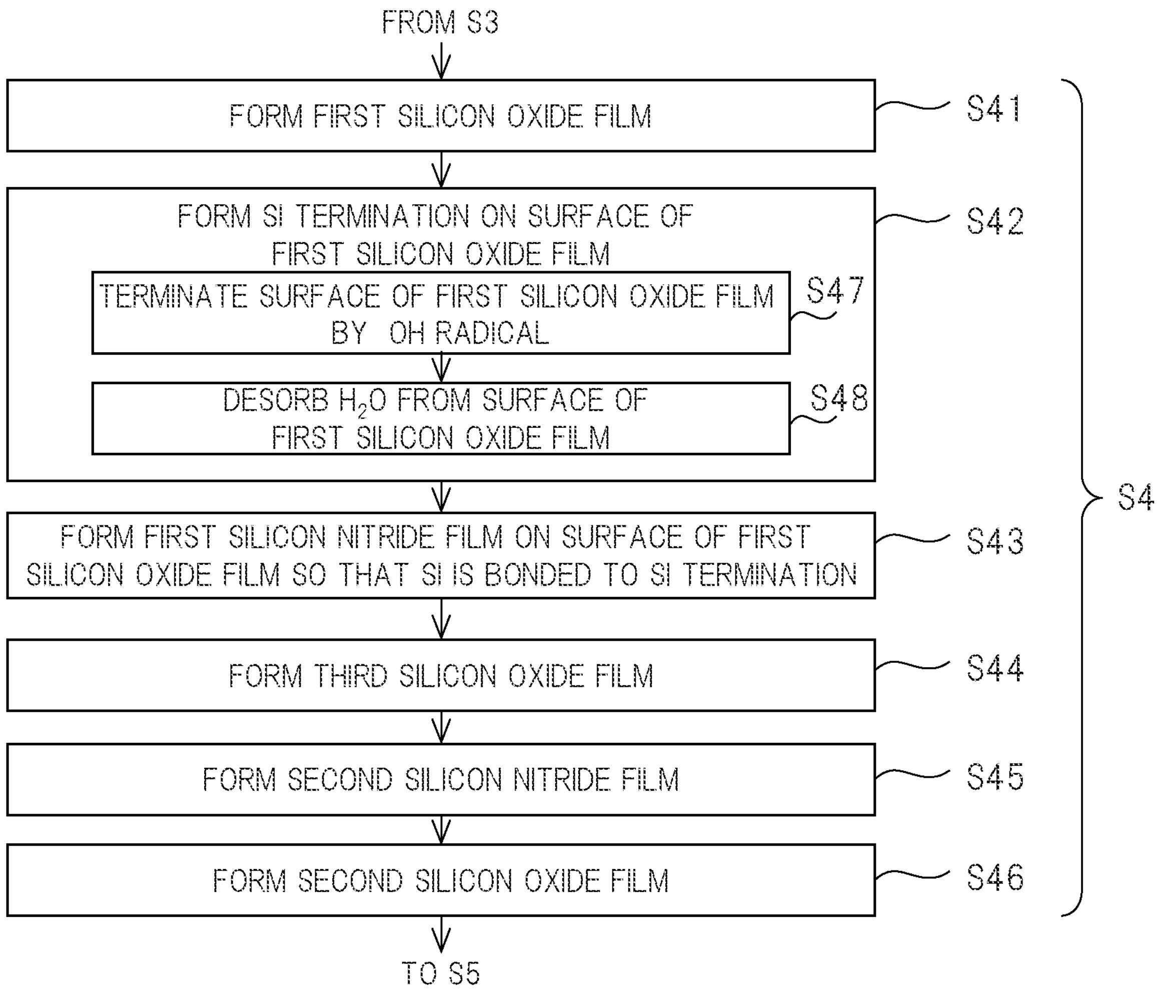
FIG. 7 is a flowchart illustrating a step of forming an insulating film portion to become the gate insulating film in the method of manufacturing a semiconductor device according to the present embodiment.

Subsequently, a laminated body of insulating films to become a gate insulating film GIM is formed on the main surface MSF (a step (S4)). This step (S4) includes a step (S41) to a step (S46) illustrated in FIG. 7.

Figure 8:
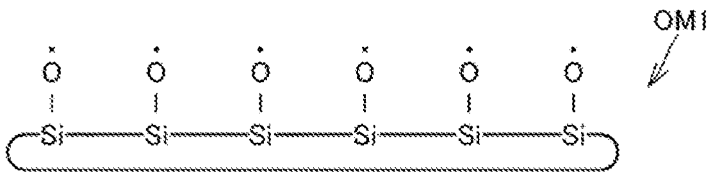
FIG. 8 is a schematic diagram for explaining termination of a first silicon oxide film in a step (S41) of the method of manufacturing a semiconductor device according to the present embodiment.

First, a first silicon oxide film OM1 is formed on the main surface MSF (a step (S41)). The first silicon oxide film OM1 is formed by heating the main surface MSF in an atmosphere containing oxygen, for example. In other words, the first silicon oxide film OM1 is thermal oxide film, for example. As illustrated in FIG. 8, a surface of the first silicon oxide film OM1 formed by this step (S41) is terminated by O atoms.

Subsequently, Si terminations are formed on a surface of the first silicon oxide film OM1 (that is, an upper surface located on the side opposite to the surface in contact with the main surface MSF) (S42). In other words, a state where the surface of the first silicon oxide film OM1 is terminated by Si atoms is realized.

This step (S42) includes: a step (S47) of forming OH terminations on the surface of the first silicon oxide film OM1; and a step (S48) of heating the surface of the first silicon oxide film OM1 after the step (S47) to desorb $H_2O$ from the surface.

In the step (S47), the surface of the first silicon oxide film OM1 is exposed to at least one selected from a group consisting of hydrochloric acid-hydrogen peroxide mixture (HPM), ammonia-hydrogen peroxide mixture (APM), hydrofluoric acid (HF), a treatment liquid containing water, hydrogen plasma, hydrogen peroxide gas, and water vapor. The solution or atmosphere to which the surface of the first silicon oxide film OM1 is exposed can be selected from the above group in accordance with density of Si—Si bonds to be formed in a boundary portion BR. In other words, the density of the Si—Si bonds varies depending upon the solution or atmosphere to which the surface of the first silicon oxide film OM1 is exposed in this step (S47). For example, the density of the Si—Si bonds formed in the boundary portion BR in case of using the APM becomes higher than the density of the Si—Si bonds formed in the boundary portion BR in case of using the HPM, but becomes lower than the density of the Si—Si bonds formed in the boundary portion BR in case of using the HF.

Figure 9:
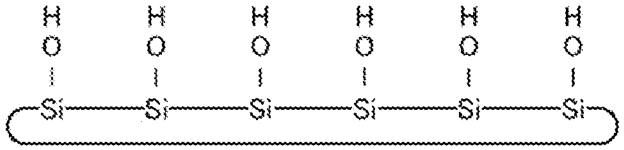
FIG. 9 is a schematic diagram for explain termination of the first silicon oxide film in a step (S47) in a step (S42) of the method of manufacturing a semiconductor device according to the present embodiment.

As illustrated in FIG. 9, OH terminations respectively terminated by OH radicals are formed on the surface of the first silicon oxide film OM1 subjected to this step (S47). Density of the OH terminations on the surface of the first silicon oxide film OM1 can be calculated as surface density of silanol radicals calculated by a bromine-based coupling agent modification method.

Figure 10:
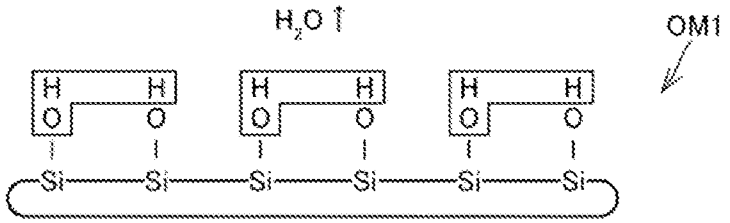
FIG. 10 is a schematic diagram for explaining termination of the first silicon oxide film in a step (S48) in the step (S42) of the method of manufacturing a semiconductor device according to the present embodiment.
Figure 11:
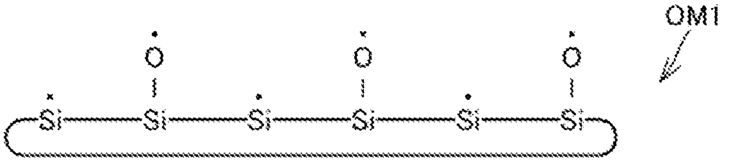
FIG. 11 is a schematic diagram for explaining termination of the first silicon oxide film after the step (S48) in the step (S42) of the method of manufacturing a semiconductor device according to the present embodiment.

In step (S48), the surface of the first silicon oxide film OM1 on which the OH terminations are formed is heated. As a result, as illustrated in FIG. 10, one OH radical and an O atom in the other OH radical of two adjacent OH radicals are desorbed as $H_2O$ gas. As a result, as illustrated in FIG. 11, Si terminations respectively terminated by Si atoms and O terminations respectively terminated by O atoms are formed on the surface of the first silicon oxide film OM1. The O termination is formed next to the Si termination.

Figure 12:
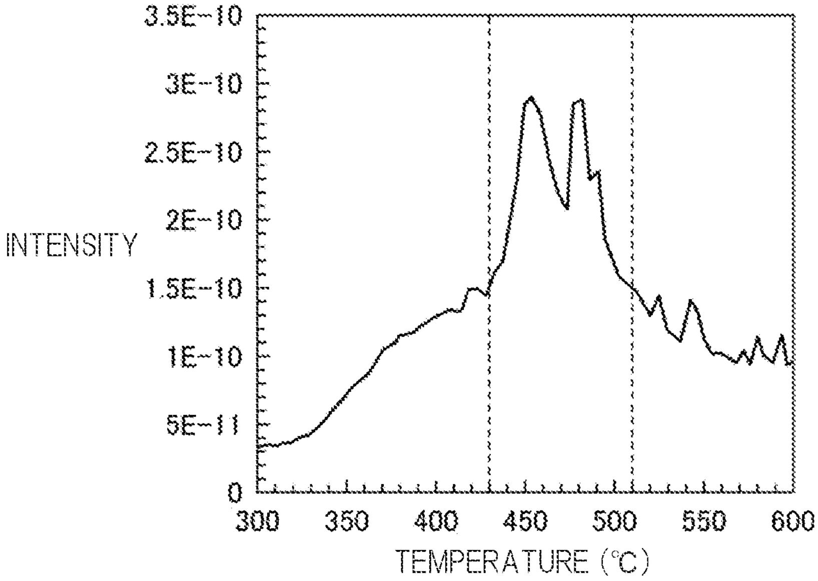
FIG. 12 is a graph illustrating a result of thermal desorption gas analysis for $H_2O$ gas desorbed from a surface of the first silicon oxide film in the step (S48) of the method of manufacturing a semiconductor device according to the present embodiment.

Heat temperature in this step (S48) is 380° C. or higher and 550° C. or lower, for example. Preferably, the heat temperature is 430° C. or higher and 520° C. or lower. FIG. 12 is a graph illustrating a result of thermal desorption gas analysis for $H_2O$ gas to be desorbed from the surface of the first silicon oxide film OM1 terminated by the OH radicals. A horizontal axis of FIG. 12 denotes heat temperature (unit: ° C.), and a vertical axis of FIG. 12 denotes intensity of $H_2O$ gas. As illustrated in FIG. 12, it was confirmed that a relatively large amount of $H_2O$ gas is desorbed from the surface of the first silicon oxide film OM1 when the heat temperature in this step (S48) is within a range between 380° C. or higher and 550° C. or lower. The heating in this step (S48) can be performed as preheating for the heating for forming a first silicon nitride film NM1 in the subsequent step (S43), for example.

Figure 13:
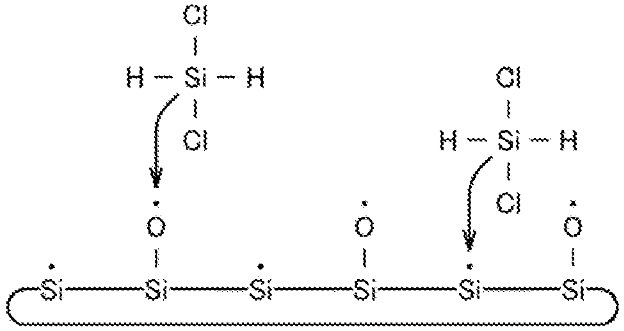
FIG. 13 is a schematic diagram for explaining termination of the first silicon oxide film in a first state of a step (S43) of the method of manufacturing a semiconductor device according to the present embodiment.
Figure 14:
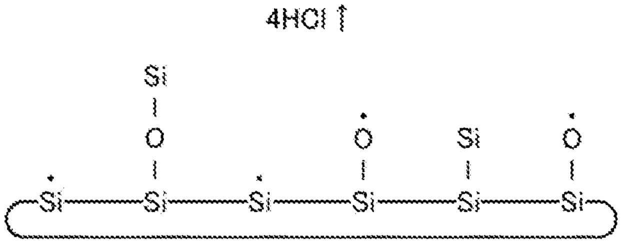
FIG. 14 is a schematic diagram for explaining termination of the first silicon oxide film in a second state realized after the first state of the step (S43) of the method of manufacturing a semiconductor device according to the present embodiment.

Subsequently, a first silicon nitride film NM1 is formed on the surface of the first silicon oxide film OM1 so that Si is bonded to the Si termination (step (S43)). A method of forming the first silicon nitride film NM1 is an Atomic Layer Deposition (ALD) method, for example. In this step (S43), dichlorosilane ($SiH_2Cl_2$) contained in the raw material gas for forming the first silicon nitride film NM1 is supplied to each of the Si terminations and the O terminations formed on the surface of the first silicon oxide film OM1 in the step (S42). As a result, as illustrated in FIG. 13, Si in dichlorosilane ($SiH_2Cl_2$) is bonded to the Si termination, and hydrogen chloride (HCl) is further desorbed, whereby as illustrated in FIG. 14, Si—Si bonds are formed on the surface described above. Moreover, Si in dichlorosilane ($SiH_2Cl_2$) is bonded to the O termination, and hydrogen chloride (HCl) is further desorbed, whereby as illustrated in FIG. 14, Si—O bonds are formed on the surface described above.

Figure 15:
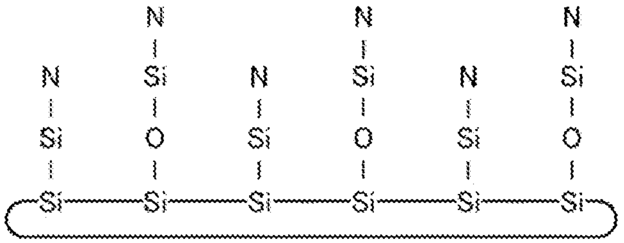
FIG. 15 is a schematic diagram for explaining termination of the first silicon oxide film in third state realized after the second state of the step (S43) of the method of manufacturing a semiconductor device according to the present embodiment.

In this step (S43), ammonia ($NH_3$) contained in the raw material gas for forming the first silicon nitride film NM1 is further supplied to Si bonded to the Si termination and Si bonded to the O termination, whereby as illustrated in FIG. 15, Si—N bonds are formed an this manner, the first silicon nitride film NM1 is formed.

This step (S43) is continuously performed without exposing the surface of the first silicon oxide film CMI to the atmosphere containing oxygen after the step (S42), for example. This step (S43) is performed without lowering temperature of the surface of the first silicon oxide film OM1 after the step (S42), for example. In a case where the first silicon nitride film NM1 is formed by the ALD method, the heat temperature in this step (S43) can be set to 380° C. or higher and 550° C. or lower in the similar manner to the previous step (S48).

Subsequently, a third silicon oxide film OM3 is formed on the first silicon nitride film NM1 (a step (S44)). The third silicon oxide film OM3 can be formed by exposing an upper surface of the first silicon nitride film NM1 to a treatment liquid containing water, for example.

Subsequently, a second silicon nitride film NM2 is formed on the third silicon oxide film OM3 (a step (S45)). A method of forming the second silicon nitride film NM2 is an LPCVD method, for example.

Subsequently, a second silicon oxide film OM2 is formed on the second silicon nitride film NM2 (a step (S46)). A method of forming the second silicon oxide film OM2 is an LPCVD-HTO (High Temperature Oxidation) method, for example.

In the step (S4), the laminated body of the insulating films, which will be processed to the gate insulating film GIM, is formed in this manner in the subsequent step (S6).

Subsequently, as illustrated in FIG. 6, a conductive film, which will be processed to a gate electrode CGE at the subsequent step (S6), is formed on the laminated body of the insulating films formed in the step (S4) (a step (S5)). A method of forming the conductive film is a CVD method, for example.

Subsequently, the laminated body of the insulating films and the conductive film formed in the step (S5) are processed to form the gate insulating film GIM and the gate electrode CGE (a step (S6)). A method of forming the gate insulating film GIM and the gate electrode CGE includes a photolithography process and an etching process, for example.

Subsequently, a first portion SR1 of a source region SR and a third portion DR1 of a drain region DR is formed on the main surface NSF of the semiconductor substrate SUB (a step (S7)). A method of forming the first portion SR1 and the third portion DR1 is an ion implantation method by using the gate electrode CGE as a mask, for example. As a result, when the main surface NSF is viewed in u plan view, the first portion SR1 and the third portion DR1 are formed on the well region WR so as to sandwich the gate electrode CGE.

Subsequently, sidewall spacers SW are formed on the main surface MSF of the semiconductor substrate SUB (a step (S8)). A method of forming the sidewall spacers SW includes a film forming process, a photolithography process, and an etching back process, for example. As a result, the sidewall spacer SW is formed on a part of each of the first portion SR1 and the third portion DR1.

Subsequently, a second portion SR2 of the source region SR and a fourth portion DR2 of the drain region DR are formed on the main surface MSF of the semiconductor substrate SUB (a step (S9)). A method of forming the second portion SR2 and the fourth portion DR2 is an ion implantation method using the gate electrode CCE and the sidewall spacers SW as masks, for example. As a result, when the main surface MSF is viewed in a plan view, the second portion SR2 and the fourth portion DR2 are formed on the well region WR so as to sandwich the gate electrode CGE and the sidewall spacers SW.

Subsequently, silicides CNT1 and CNT2, an insulating film IF, an interlayer insulating film IL1, and contact plugs CPG are formed in this order (a step (S10)). In this step (S10), first, the silicide CNT1 is formed on the second portion SR2 of the source region SR and the fourth portion DR2 of the drain region DR, and the silicide CNT2 is formed on the gate electrode CGE. A method of forming the silicides CNT1 and CNT2 includes a film forming process of a metal film, an anneal process, and an etching process, for example. Second, the insulating film IF and the interlayer insulating film IL1 are formed on the main surface MSF. A method of forming the insulating film IF and the interlayer insulating film IL1 includes a film forming process, a photolithography process for forming contact holes in the formed laminated body, and an etching process, for example. Third, the contact plugs CPG are respectively formed inside the contact holes. A method of forming the contact plugs CPG includes a film forming process, an etching back process, or a chemical mechanical polishing (CMP) process, for example.

Subsequently, an interlayer insulating film IL2 and wirings ML are formed (a step (S11)). In this step (S11), first, the interlayer insulating film IL2 is formed on the interlayer insulating film IL1. A method of forming the interlayer insulating film IL2 includes a film forming process, a photolithography process for forming wiring trenches in the formed insulating film, and an etching process, for example. Second, the wirings ML are formed in the wiring trenches of the interlayer insulating film IL2. A method of forming the wirings ML includes a film forming process, an etching back process, or a CMP process, for example.

The transistor MT of the semiconductor device MCP illustrated in FIG. 2 is formed in this manner.

Effects

Next, effects of the present embodiment will be described with reference to FIG. 16 to FIG. 22 on the basis of comparison with a comparative example.

Figure 16:
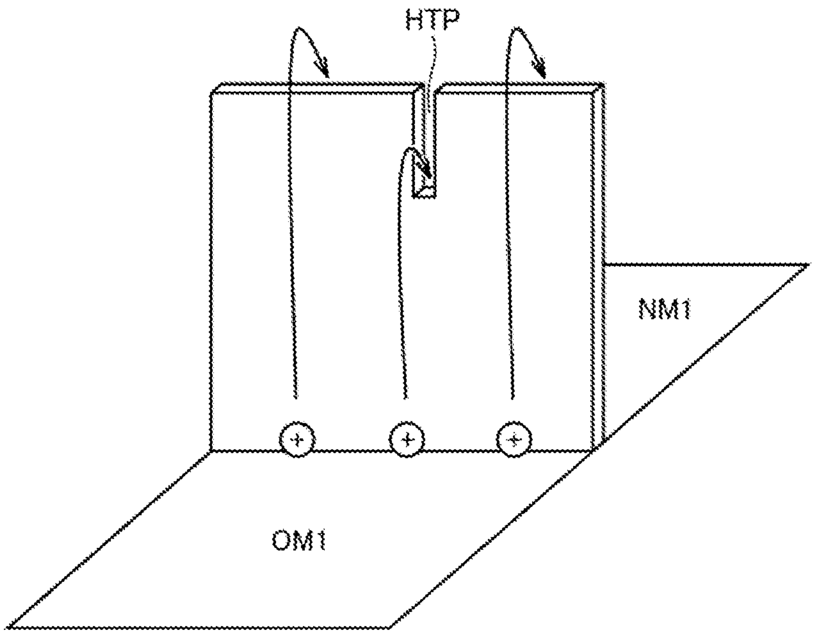
FIG. 16 is a schematic diagram for explaining a potential barrier formed at a boundary portion between the first silicon oxide film and the first silicon nitride film with respect to holes injected from a semiconductor substrate into the first silicon nitride film at the time of an erasing operation of the semiconductor device according to the present embodiment.
Figure 18:
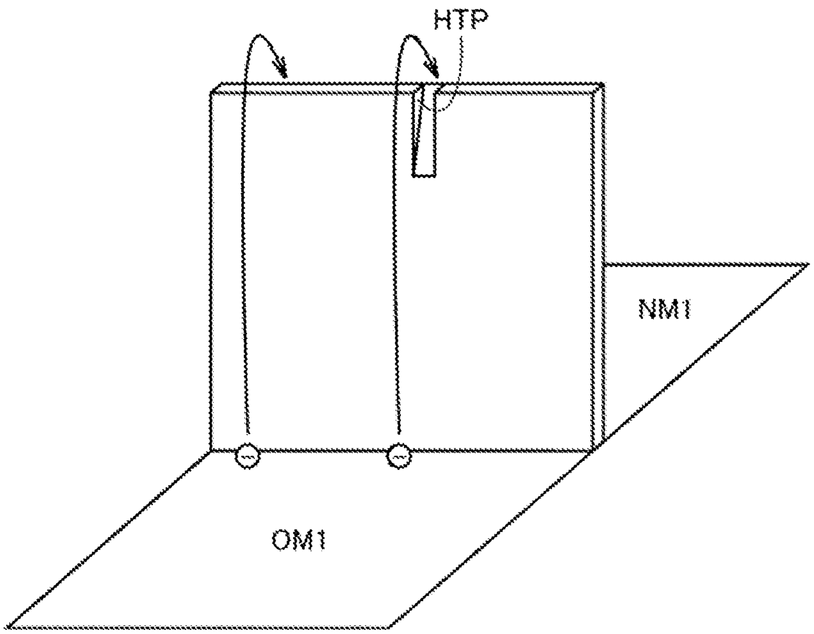
FIG. 18 is a schematic diagram for explaining a potential barrier formed at a boundary portion between the first silicon oxide film and the first silicon nitride film with respect to electrons accumulated in the first silicon nitride film when no voltage is applied between a gate electrode and the semiconductor substrate of the semiconductor device according to the present embodiment.

FIG. 16 is a schematic diagram for explaining a potential barrier formed between the first silicon oxide film OM1 and the first silicon nitride film NM1 with respect to the holes injected from the semiconductor substrate SUB into the first silicon nitride film NM1 at the time of the erasing operation. FIG. 18 is a schematic diagram for explaining a potential barrier formed between the first silicon oxide film OM1 and the first silicon nitride film NM1 with respect to the electrons accumulated in the first silicon nitride film NM1 at the time of data retention.

Figure 17:
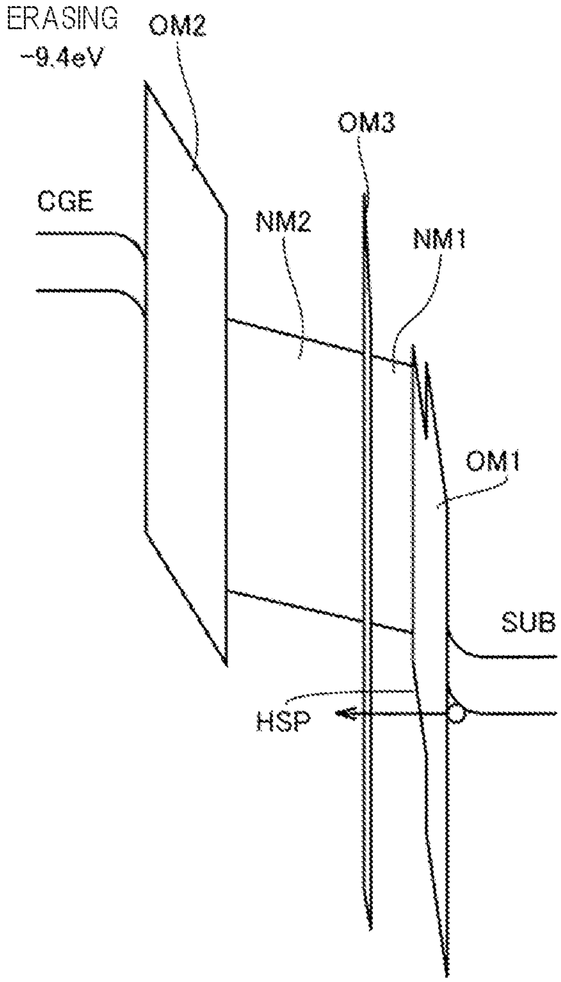
FIG. 17 is an energy band diagram at the erasing operation of the semiconductor device according to the present embodiment.
Figure 19:
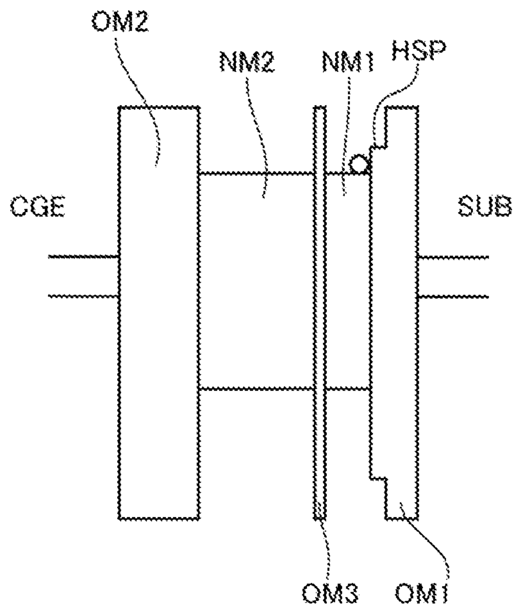
FIG. 19 is an energy band diagram when no voltage is applied between the gate electrode and the semiconductor substrate of the semiconductor device according to the present embodiment.
Figure 20:
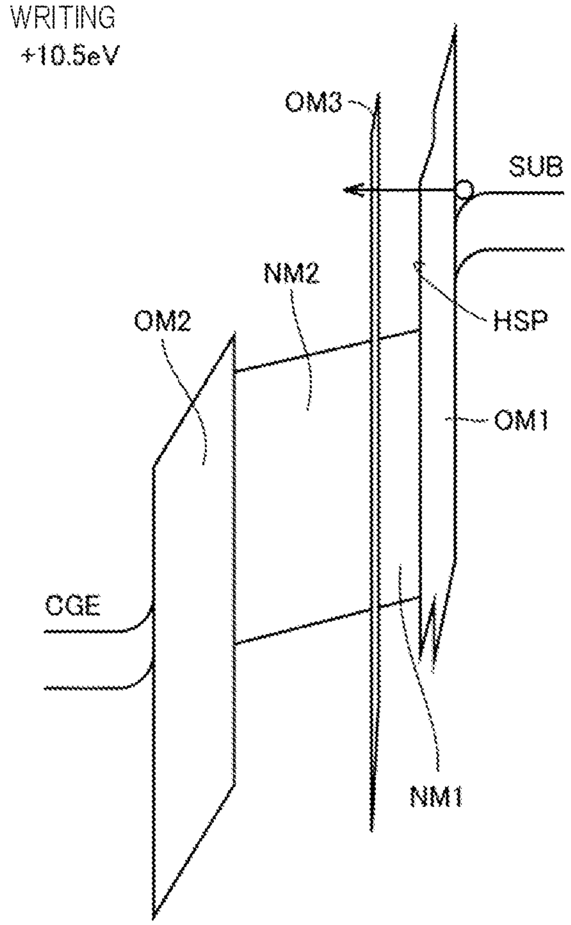
FIG. 20 is an energy band diagram at the time of a writing operation of the semiconductor device according to the present embodiment.

FIG. 17, FIG. 19, and FIG. 20 are energy band diagrams when the semiconductor substrate SUB, the first silicon oxide film OM1, the first silicon nitride film NM1, the third silicon oxide film OM3, the second silicon nitride film NM2, and the second silicon oxide film OM2 according to the present embodiment are respectively a Si single crystal substrate, $SiO_2$, $Si_3N_4$ by an ALD method, $SiO_2$, $Si_3N_4$ by an LPCVD method, and $SiO_2$. FIG. 17 is an energy band diagram when erasing voltage is applied between the gate electrode and the semiconductor substrate (hereinafter, referred to as "at the time of an erasing operation"). FIG. 19 is an energy band diagram when the thickness of the first silicon oxide film is reduced and no voltage is applied between the gate electrode CGE and the semiconductor substrate SUB (hereinafter, referred to as "at the time of data retention"). FIG. 20 is an energy band diagram when writing voltage is applied between the gate electrode CGE and the semiconductor substrate SUB of the transistor MT (hereinafter, referred to as "at the time of a writing operation").

The comparative example is different from the present embodiment only in that Si—Si bonds, that is hole-through points HTP are not formed in a boundary portion between a first silicon oxide film and a first silicon nitride film of a gate insulating film. Operating conditions such as a thickness of the first silicon oxide film, and erasing voltage/writing voltage are the same between the present embodiment and the comparative example. In the comparative example, in order to increase hole injection efficiency at the time of the erasing operation, it is necessary to reduce a thickness of a first silicon oxide film. On the other hand, when the thickness of the first silicon oxide film is reduced, electrons accumulated in the first silicon nitride film at the time of the data retention are likely to tunnel to a semiconductor substrate via the first silicon oxide film, and this causes retention characteristics to deteriorate.

On the other hand, in the present embodiment, the Si—Si bonds are formed in the boundary portion BR between the first silicon oxide film OM1 and the first silicon nitride film. NM1, and these act as the hole-through points HTP. Specifically, as illustrated in FIG. 16, in a region where the hole-through point HTP formed of the Si—Si bond is formed in the boundary portion BR, a potential barrier for the holes injected from the semiconductor substrate SUB into the first silicon nitride film NM1 at the time of the erasing operation locally becomes lower as compared with the other regions. As illustrated in FIG. 17, this is because a bandgap in the vicinity of an interface of the first silicon oxide film OM1 becomes smaller than a bandgap inside the first silicon oxide film OM1 due to formation of the hole-through points HTP. As a result, in the present embodiment, the hole injection efficiency the time of the erasing operation becomes higher than that in the comparative example. Namely, in the present embodiment, it is possible to enhance the hole injection efficiency at the time of the erasing operation without reducing the thickness of the first silicon oxide film OM1.

On the other hand, as illustrated in FIG. 18, a potential barrier for the electrons accumulated in the first silicon nitride film NM1 at the time of the data retention has the same height between the region where the hole-through point HTP is formed and the other regions. As illustrated in FIG. 19, this is because a bandgap in the vicinity of the interface of the first silicon oxide film OM1 is larger than a bandgap of the first silicon nitride film NM1.

As described above, according to the semiconductor device MCP of the present embodiment, it is possible to shorten an erasing time, and suppress deterioration o retention characteristics.

Modification Example

The gate insulating film GIM of the semiconductor device MCP according to the present embodiment includes the third silicon oxide film OM3 and the second silicon nitride film NM2 in addition to the first silicon oxide film OM1, the first silicon nitride film NM1, and the second silicon oxide film OM2, but is not limited to this. The gate insulating film GIM may be configured as a laminated body in which only the first silicon oxide film OM1, the first silicon nitride film NM1, and the second silicon oxide film OM2 are laminated in this order. In this case, Si—Si bonds may also be formed in a boundary portion between the first silicon oxide film OM1 and the first silicon nitride film NM1.

Evaluation. Result of Erasing Time

Figure 21:
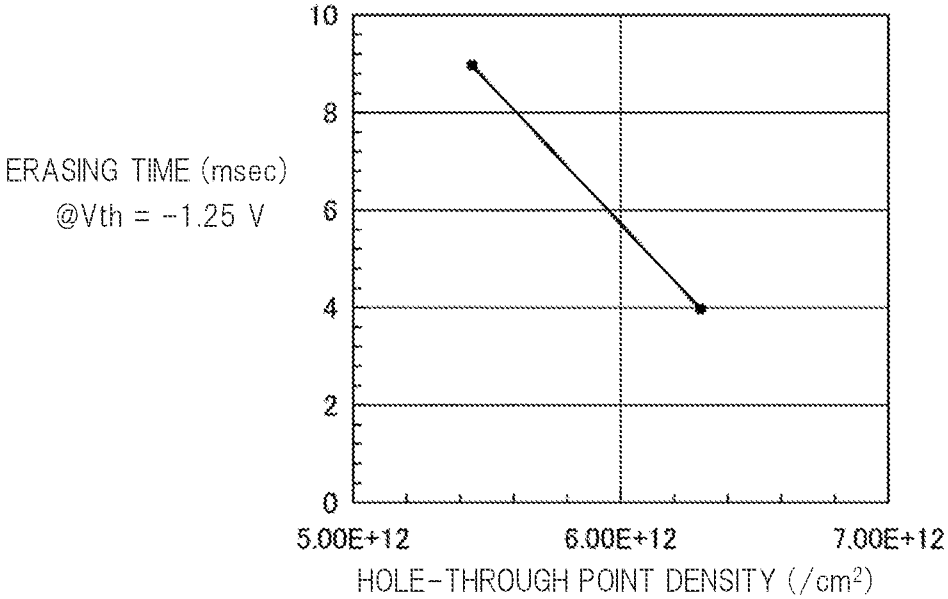
FIG. 21 is a graph illustrating an erasing time of the semiconductor device according to the present embodiment and an erasing time of a semiconductor device according to a comparative example.

FIG. 21 is a graph illustrating evaluation results of an erasing time of two examples of the semiconductor device according to the present embodiment in which only the densities of Si—Si bonds in the boundary portion BR are different from each other. A horizontal axis of FIG. 21 denotes the density of Si—Si bonds (unit: pieces/cm$^2$), and a vertical axis of FIG. 21 denotes the erasing time (unit: milliseconds). The density of Si—Si bonds according to a first example was $6.30\times10^{12}$ pieces/cm$^2$, and the density of Si—Si bonds according to a second example was $5.45\times10^{12}$ pieces/cm$^2$. Threshold voltage was set to −1.25 V. As illustrated in FIG. 21, the erasing time of the first example was shortened to a half of the erasing time of the second example or less. Namely, it was confirmed that the Si—Si bonds formed in the boundary portion BR act as the hole-through points HTP.

Evaluation Result of Retention Characteristics

Figure 22:
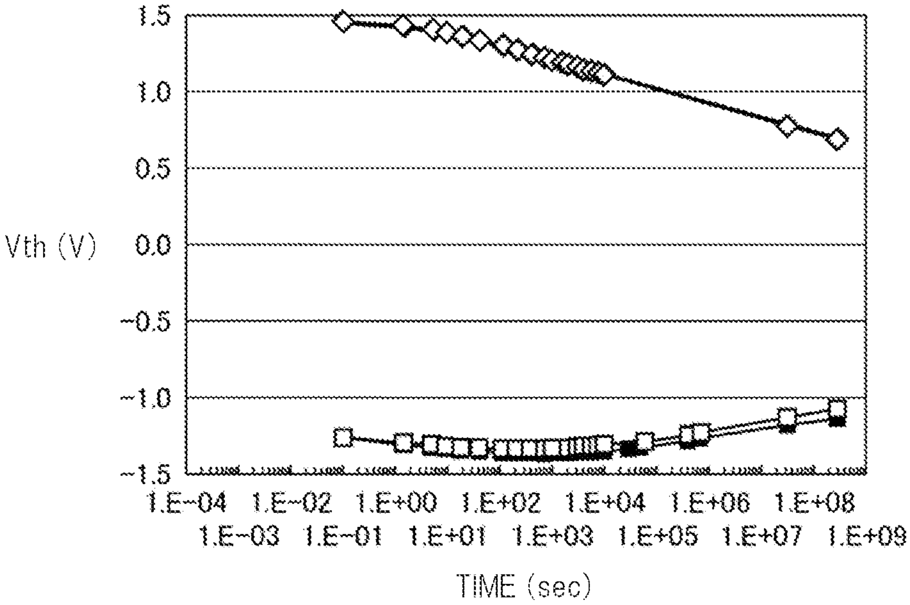
FIG. 22 is graph illustrating retention characteristics of the semiconductor device according to the present embodiment and retention characteristics of the semiconductor device according to the comparative example.

When the amount of electrons accumulated in the first silicon nitride film and the second silicon nitride film fluctuates, threshold voltage Vth of the memory cell fluctuates. In this experiment, retention characteristics were evaluated on the basis of the fluctuation amount of the threshold voltage when the semiconductor device was left under environment of 90° C. FIG. 22 is a graph illustrating an evaluation result of the retention characteristics of each of the semiconductor device according to the present embodiment and the above comparative example that is different from the present embodiment only in that no Si—Si bond is formed in a boundary portion between a first silicon oxide film and a first silicon nitride film. A horizontal axis of FIG. 22 denotes the above exposing time (unit: seconds), and a vertical axis of FIG. 22 denotes threshold voltage (unit: V). In FIG. 22, white plots indicate an evaluation result of the present embodiment, and black plots indicate an evaluation result of the comparative example. As illustrated in FIG. 22, the white plots overlap with the black plots. Thus, the retention characteristics of the semiconductor device according to the present embodiment were equivalent to the retention characteristics according to the comparative example. Namely, it was confirmed that the Si—Si bonds formed in the boundary portion BR does not cause the retention characteristics to deteriorate.

As described above, the invention made by the inventor of the present application has been described specifically on the basis of the embodiment. However, the present invention is not limited to the embodiment described above, and it goes without saying that the present invention may be modified into various forms without departing from the substance thereof.

What is claimed is:

1. A method of manufacturing a semiconductor device, the method comprising:
- forming a gate insulating film on a main surface of a semiconductor substrate; and
- forming a gate electrode on the gate insulating film,
- wherein the forming the gate insulating film includes:
  - forming a silicon oxide film on the main surface;
  - forming Si terminations on a surface of the silicon oxide film; and
  - forming a silicon nitride film on the surface so that Si is bonded to each of the Si terminations.

2. The method according to claim 1,
- wherein the forming the Si terminations includes:
  - forming OH terminations on the surface; and
  - after the forming the OH terminations, desorbing $H_2O$ from the surface by heating the surface.

3. The method according to claim 2,
- wherein in the desorbing the $H_2O$ from the surface, the surface is heated to 430° C. or higher and 520° C. or lower.

4. The method according to claim 1,
- wherein the forming the silicon nitride film is performed without exposing the surface to an atmosphere containing oxygen after the forming the Si terminations.

5. The method according to claim 1,
- wherein in the forming the Si terminations, the surface is exposed to at least one selected from a group consisting of hydrochloric acid-hydrogen peroxide mixture (HPM), ammonia-hydrogen peroxide mixture (APM), hydrofluoric acid (HF), a treatment liquid containing water, hydrogen plasma, hydrogen peroxide gas, and water vapor.

6. The method according to claim 1,
- wherein in the forming the silicon oxide film, the silicon oxide film is formed by heating the main surface under an atmosphere containing oxygen.

* * * * *